(12) United States Patent
Johnson

(10) Patent No.: US 7,284,220 B1
(45) Date of Patent: Oct. 16, 2007

(54) METHOD AND SYSTEM FOR ANALYTICAL PLACEMENT OF COMPONENTS FOR A CIRCUIT DESIGN

(75) Inventor: Kirk L. Johnson, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 73 days.

(21) Appl. No.: 10/966,269

(22) Filed: Oct. 15, 2004

(51) Int. Cl.
*G06F 17/50* (2006.01)
(52) U.S. Cl. .......................................................... 716/9
(58) Field of Classification Search ..................... 716/4, 716/2, 8, 9, 10; 726/9
See application file for complete search history.

(56) References Cited

U.S. PATENT DOCUMENTS

| 6,415,425 | B1 * | 7/2002 | Chaudhary et al. | 716/9 |
| 6,671,867 | B2 * | 12/2003 | Alpert et al. | 716/10 |
| 6,957,406 | B1 * | 10/2005 | Stenz | 716/9 |
| 2005/0166164 | A1 * | 7/2005 | Ren et al. | 716/2 |
| 2005/0166169 | A1 * | 7/2005 | Kurzum et al. | 716/10 |
| 2005/0235237 | A1 * | 10/2005 | Alpert et al. | 716/8 |

OTHER PUBLICATIONS

Hans Eisenmann et al.; "Generic Global Placement and Floorplanning"; DAC '98; Copyright 1998; pp. 269-274.

* cited by examiner

*Primary Examiner*—Jack Chiang
*Assistant Examiner*—Brandon W. Bowers
(74) *Attorney, Agent, or Firm*—Pablo Meles; LeRoy D. Maunu; Michael R. Hardaway

(57) ABSTRACT

A method of performing analytical placement of components for a circuit design can include the steps of modifying an analytical formulation for placement of the circuit design a priori (when the circuit design or programmable device fabric includes inhomogeneous components) providing a modified analytical formulation and applying the modified analytical formulation during placement of the circuit design. The step of modifying can optionally include introducing terms into the analytical formulation that push components away from locations in which they cannot reside (such as a large hole in the programmable device fabric due to a large, fixed component such as a CPU core) or alternatively or optionally the step of introducing (115) terms into the analytical formulation that pull components that can only reside at a relatively small number of locations towards those locations.

17 Claims, 3 Drawing Sheets

METHOD AND SYSTEM FOR ANALYTICAL PLACEMENT OF COMPONENTS FOR A CIRCUIT DESIGN

BACKGROUND

1. Field of the Invention

This invention relates to the field of circuit design and, more particularly, to the use of analytical placement to optimize placement of components for a given design.

2. Description of the Related Art

Efficiently and optimally placing components on a device for a given mapped design and a given device continues to be a challenge as designs become ever increasingly complex. The placement problem forces a decision as to where or which sites on the device the components from the design should be placed. Analytical placement is one solution for the placement problem. In analytical placement, the placement problem is typically formulated as a problem of minimizing an equation that represents some goodness-of-placement metric. Variables in this equation correspond to the locations of components to be placed. Typical goodness-of-placement metrics might attempt to estimate the total amount of wirelength that would be needed to connect the components as specified by the design. Thus, the placement problem is reduced to finding a set of variable values (i.e., component placements) that minimize the value of the equation (i.e., optimize for whatever metrics are represented by the equation). In general, the solution to the minimization problem provides a set of real-valued locations that do not map directly to discrete sites into which components can be placed, but instead to an abstract two-dimensional location space that covers the device. Thus, the real-valued locations for components resulting from the solution of the minimization problem must be discretized into a set of specific device sites into which components can be placed, resolving any overlap that may arise due to multiple real-valued locations falling within the area that would most naturally map to a particular site. One approach to resolving such overlap issues employs an iterative scheme in which the system of equations is repeatedly incrementally modified to introduce "spreading forces" that attempt to push components away from oversubscribed areas and toward undersubscribed areas. This iterative approach generally works well as long as there are no significant restrictions on where individual components can or must be placed.

Traditionally, analytical placement assumes a homogeneous substrate in which any component from the design can, in effect, be placed at essentially any location on the device (modulo discretization of the real-valued locations to specific device sites). However, the assumption of a homogeneous substrate fails to hold true for some recent FPGA families. In particular, some recent FPGA devices can have features like CPU cores (which leave a large "hole" in the real-valued location space into which no other component types can be placed) and BlockRAMs and multipliers (which can only be placed in a relatively small number of device sites, effectively causing a large fraction of the real-valued location space to be made up of "holes" into which components of those types cannot be placed). Thus, analytical placement may yield infeasible locations. In other words, analytical placement yields real-valued locations for components that have no directly-corresponding device site at which the component could be placed (e.g., due to a "hole" in the device fabric to accommodate a large block such as a CPU core that precludes placement of any other component types or due to a component type that can only be placed at one of a relatively small number of locations on the device). In such a scenario, the discretization process may yield actual placements that are significantly different from the solution suggested by the analytical placement process. Existing approaches attempt to address these problems a posteriori, by introducing "spreading forces" (as described above) that attempt to move components away from infeasible locations and towards feasible locations in which they could actually be placed. No known existing approaches to the placement problem attempt to address these problems a priori.

SUMMARY OF THE INVENTION

Embodiments according to the present invention provide a method, system, and apparatus for performing analytical placement in the context of an inhomogeneous device substrate in which inhomogeneity issues are addressed at least in part in an a priori manner, instead of only addressing inhomogeneity issues in an a posteriori manner, after an invalid proposed placement has already been realized. An inhomogeneous device substrate can include large, fixed components (e.g., CPU cores) that create locations or "holes" where other components cannot be placed or limited sets of locations in which certain types of components (e.g., BlockRAMs or multipliers) must be placed. Existing analytical placement schemes yield potentially large numbers of infeasible placements, and then attempt to address some of these issues by using only a posteriori means.

Accordingly, the present invention discourages infeasible placements through the introduction of a priori "forces" or terms in the equation being minimized that have the tendency to push components away from a hole due to a large, fixed component like a CPU core or to pull those types of components that can only be placed in a limited number of locations toward those locations. According to the first embodiment of the present invention, a method of analytical placement of components for a circuit design can include the steps of modifying an analytical formulation for placement of the circuit design a priori (when the circuit design or programmable device fabric include inhomogeneous components) providing a modified analytical formulation and applying the modified analytical formulation during placement of the circuit design. The step of modifying can include the step of introducing terms into the analytical formulation that push components away from locations in which they cannot reside (such as a large hole due to a CPU core in a programmable logic design) or alternatively or optionally the step of introducing terms into the analytical formulation that pull components that can only reside at a relatively small number of locations towards those locations.

In a second embodiment of the present invention, a method of analytical placement of components for a circuit design can include the step of applying a spreading force a priori to an analytical formulation to push components in the circuit design away from at least a first predetermined location in the circuit design and the step of applying a pulling force a priori to the analytical formulation to pull a predetermined set of components of the circuit design towards at least a second predetermined location in the circuit design.

The spreading force can be achieved by introducing additional terms to the analytical formulation that represent virtual connections between all components and locations into which no additional components can be placed. Note, the locations in which no additional components can be placed might be due to "holes" in the programmable device fabric where a large, fixed component (such as a CPU core) resides. The spreading force can be realized by applying negative (or repulsive) weights to any such introduced connections. Such negative weights will tend to cause components to be placed further away from at least the first predetermined location.

The pulling force can be achieved by introducing additional terms to the analytical formulation that represent virtual connections between components that can only be placed in a relatively small number of locations and each of the locations into which such components can be placed. The pulling force can be realized by applying positive (or attractive) weights to any such introduced connections. Such positive weights will tend to cause said components to be placed nearer to the feasible locations for those components. Note, components that can only be placed in the relatively small number of locations can include BlockRAMs and multipliers used in a programmable logic device circuit design.

The method can further include the step of applying heuristics to adjust the weights of the spreading force and the pulling force in an iteration of the analytical formulation.

By addressing part or all of the infeasible placement problem in an a priori manner, embodiments in accordance with the invention can reduce the number of subsequent iterations needed to resolve infeasibility problems after the fact and improve the quality of result.

Other embodiments of the present invention can include a machine readable storage that has been programmed to cause a machine to perform the steps disclosed herein as well as a system having means for performing the various steps described herein.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

Figure 1:
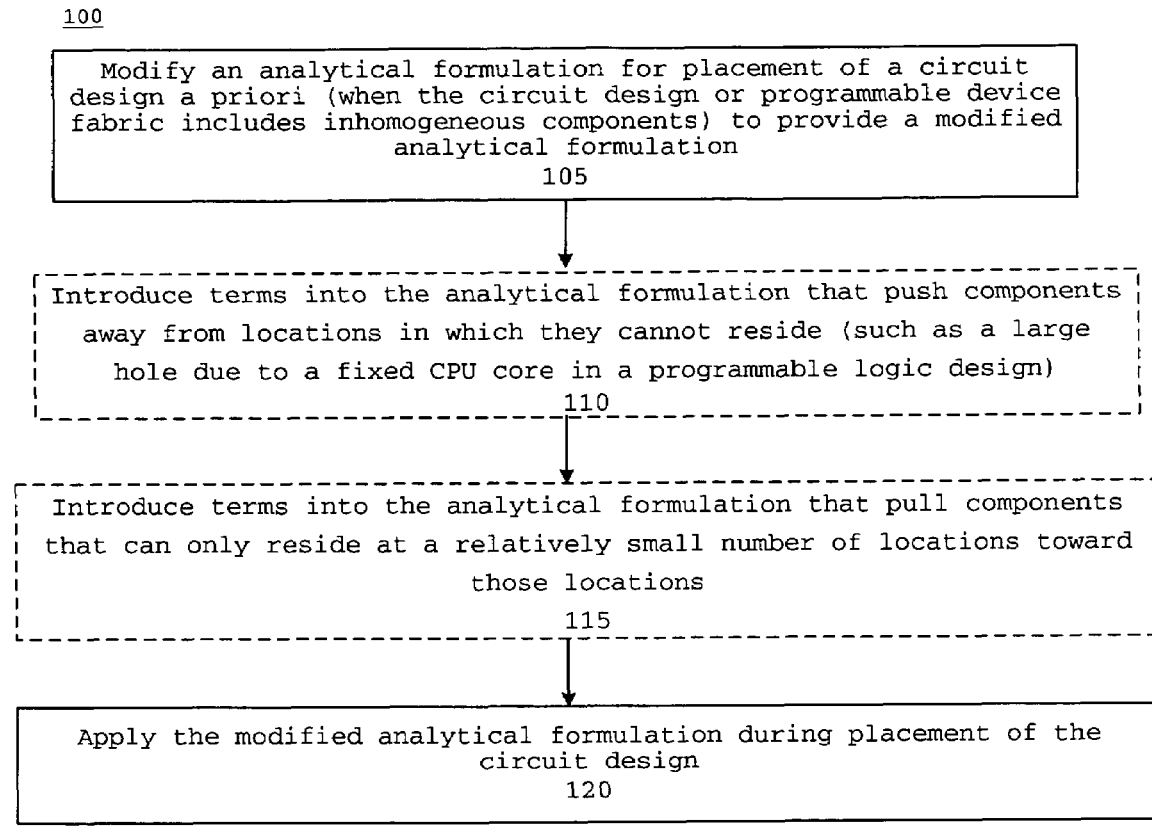
FIG. 1 is a flow chart illustrating a method of analytical placement of components for a circuit design in accordance with an embodiment of the inventive arrangements disclosed herein.

Referring to FIG. 1, a flow chart illustrates a method 100 of performing analytical placement of components for a circuit design in accordance with an embodiment of the inventive arrangements disclosed herein. The method 100 can be performed by a software-based PLD design tool operating within a suitable information processing or computer system. In one embodiment, the design tool can be configured to operate upon designs for field programmable gate arrays (FPGA's). The method 100 can include the step 105 of modifying an analytical formulation for placement of the circuit design a priori (when the circuit design includes inhomogeneous components) providing a modified analytical formulation and the step 120 of applying the modified analytical formulation during placement of the circuit design. The step of modifying can optionally include the step 110 of introducing terms into the analytical formulation that push components away from locations in which they cannot reside (such as a large hole due to a CPU core in a programmable logic design) or alternatively or optionally the step 115 of introducing terms into the analytical formulation that pull components that can only reside at a relatively small number of locations towards those locations.

Figure 2:
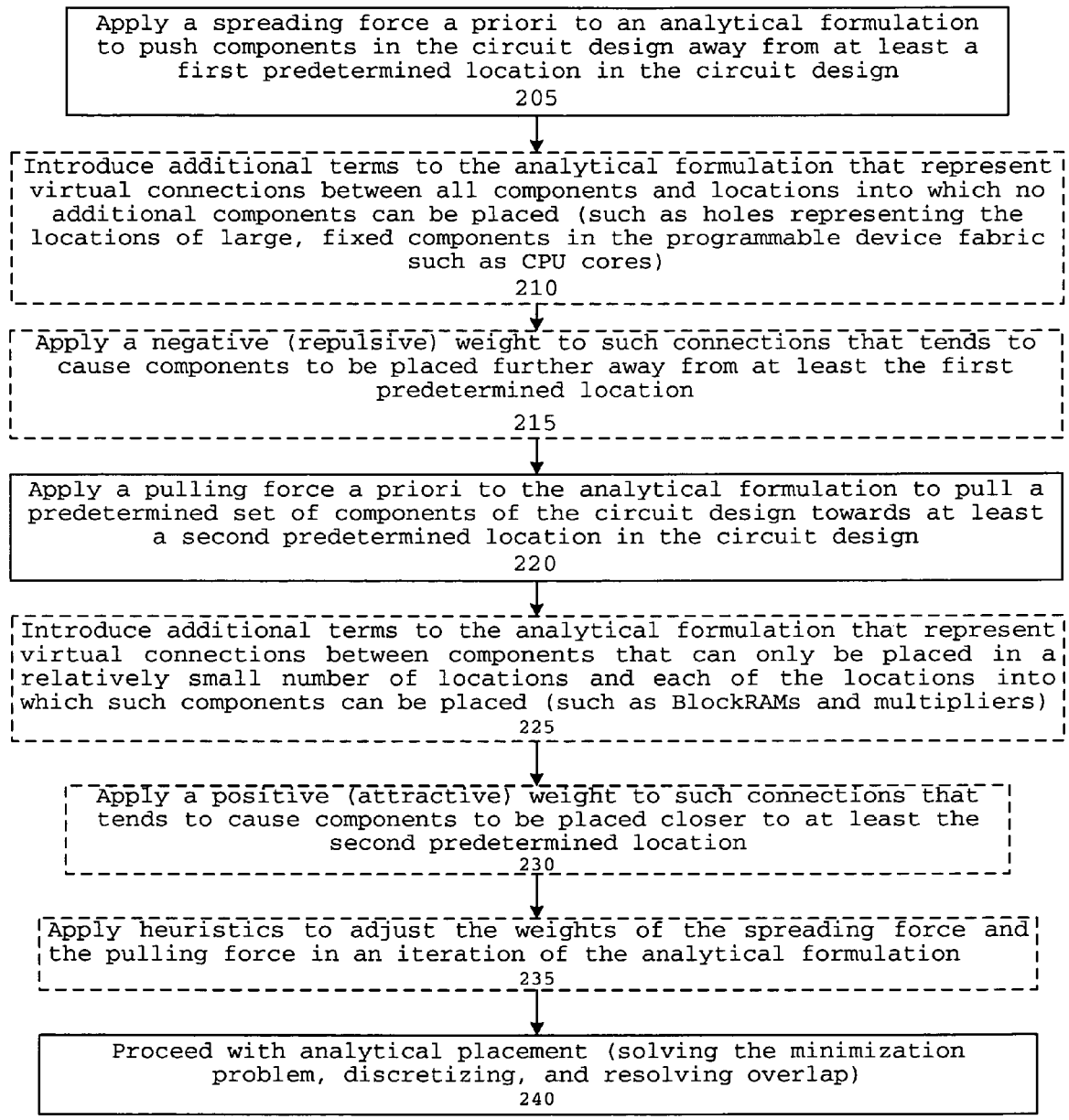
FIG. 2 is a flow chart illustrating a method of analytical placement of components for a circuit design in accordance with another embodiment of the inventive arrangements disclosed herein.

Referring to FIG. 2, a flow chart illustrates a method 200 of analytical placement of components for a circuit design in accordance with another embodiment of the present invention. The method 200 can include the step 205 of applying a spreading force a priori to an analytical formulation to push components in the circuit design away from at least a first predetermined location in the circuit design and the step 220 of applying a pulling force a priori to the analytical formulation to pull a predetermined set of components of the circuit design towards at least a second predetermined location in the circuit design.

The spreading force can be achieved by introducing additional terms to the analytical formulation that represent virtual connections between all components and locations into which no additional components can be placed as shown at block 210. Note, the locations in which no additional components can be placed can be due to "holes" in the programmable device fabric where a large, fixed component (such as a CPU core) resides. Alternatively, as shown at block 215, the spreading force can also be considered as applying a negative (repulsive) weight that tends to cause components to be placed further away from at least the first predetermined location.

The pulling force can be achieved by introducing additional terms to the analytical formulation that represent virtual connections between components that can only be placed in a relatively small number of locations and each of the locations into which such components can be placed as shown at block 225. Alternatively, as shown at block 230, the pulling force can also be considered as applying a positive (attractive weight) weight that tends to cause components to be placed closer to at least the second predetermined location. Note, components that can only be placed in the relatively small number of locations can include Block-RAMs and multipliers used in a programmable logic device circuit design.

The method 200 can further optionally include the step 235 of applying heuristics to adjust the weights of the spreading force and the pulling force in an iteration of the analytical formulation. At step 240, the method 200 can proceed with analytical placement (solving the minimization problem, discretizing, and resolving overlap). Of course, the step of applying heuristics can also be part of this analytical placement step 240.

Figure 3:
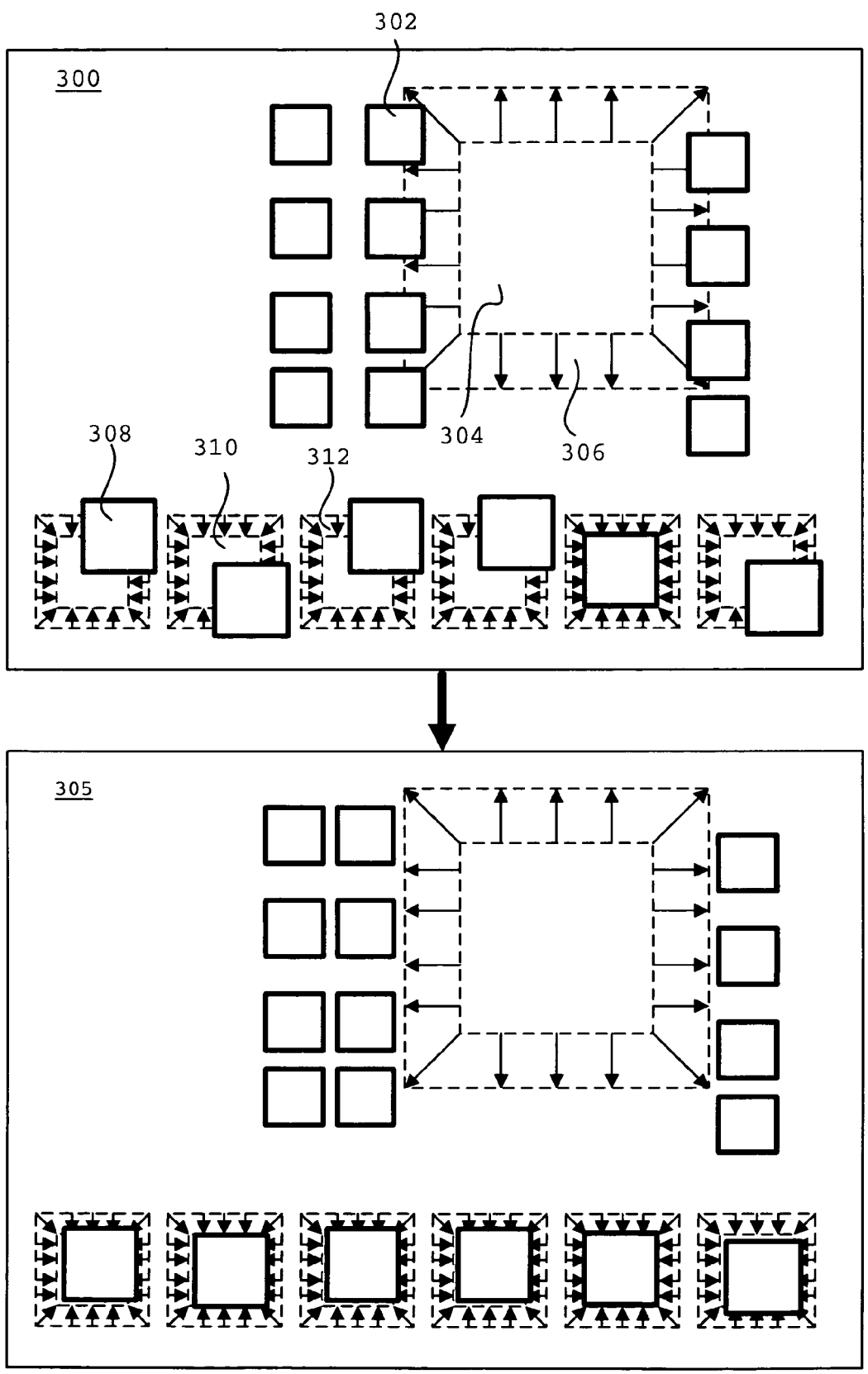
FIG. 3 is representation of the pulling and pushing forces applied to a design during analytical placement of components for a given circuit design in accordance with an embodiment of the present invention.

Referring to FIG. 3, a representation of the pulling and pushing forces applied to a design during a first iteration 300 and a second iteration 305 of the analytical placement of components for a given circuit design in accordance with an embodiment of the present invention is illustrated. In the first iteration 305, any components 302 that are placed in or near an area 304 reserved for a CPU core or other large component for example will be subject to the pushing forces represented by area 306. In contrast, any component 308 (such as BlockRAM or multipliers) that are placed near an area 310 that is generally reserved for components that have constraints as to the locations where they can be placed will be subject to the pulling forces represented by the area 312.

In other words, the area 310 can be one of a limited set of locations in which certain types of components must be placed. As can be noted in the second iteration 305, components 302 that were placed in or near the area reserved for specific components (such as CPU cores) were pushed away from the area 304 and components 308 that were placed in or near the area 310 reserved for such components were pulled closer towards the area 310.

As described above, existing approaches to analytical placement operate by formulating an equation that represents some goodness-of-placement metric, the solution of which yields a set of components placements that optimize for whatever metrics are represented by said equation. Some of the terms in this equation represent the contribution due to connections between components being placed and other components whose locations have already been fixed (e.g., I/O components that reside at fixed locations due to external constraints). Embodiments in accordance with the present invention can generally operate by introducing additional terms to the equation that represent virtual connections (1) between all components and locations into which no components may be placed (e.g., a large "hole" due to a CPU core) and (2) between components that can only be placed in a relatively small number of locations and each of the locations into which such components can be placed (e.g., as would be the case for BlockRAMs and multipliers). An analytical problem formulation can apply a negative weight to the first type of virtual connection (the type from a component to a large "hole"), which encourages solutions that tend to place components further away from such "hole". An analytical problem formulation can apply a positive weight for the second type of virtual connection (the type from a component that can only be placed at a relatively small number of locations to a location suitable for that type of component), which encourages solutions that tend to place those types of components closer to those locations in which they can actually reside. In the event that iteration is needed to obtain a feasible placement, heuristics could be used to adjust the weights of these virtual connections on subsequent iterations.

While the embodiments described above are generally in terms of an analytical placement formulation that minimizes total squared wirelength, the same idea could clearly be generalized to any other analytical formulations of the placement problem. In other words, embodiments in accordance with the invention can generally introduce a priori terms into the analytical formulation that "push" components away from locations in which they cannot reside (e.g., a large "hole" due to a CPU core) and "pull" components that can only reside at a relatively small number of locations towards those locations. In this manner, the modification of an analytical formulation can include a priori terms that can specifically address device inhomogeneity whereas existing approaches appear to ignore such inhomogeneity and attempt to address such issues a posteriori.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of analytical placement of components for a circuit design, comprising the steps of:
   modifying an equation that quantifies desirability of placement of components of the circuit design to include a first term and a second term;
   wherein the first term in the equation causes the equation to quantify a first placement of components as being more desirable than a second placement of the components as a result of a first location of at least one component in the first placement being a greater distance from a first designated area than a second location of the at least one component in the second placement, and the second term in the equation causes the equation to quantify a third placement of components as being more desirable than a fourth placement of the components as a result of a third location of at least one component in the third placement being a lesser distance from a second designated area than a fourth location of the at least one component in the fourth placement;
   performing analytical placement of the circuit design using the equation;
   evaluating the equation for desirability of placement of components of the design while performing analytical placement; and
   implementing the circuit design in a hardware circuit.

2. The method of claim 1, wherein the first designated area represents an area bounded by programmable device fabric and designated for a CPU core.

3. A method of analytical placement of components for a circuit design, comprising the steps of:
   applying a computational spreading force during analytical placement of components of the circuit design, to push components in the circuit design away from at least a first predetermined location in the circuit design;
   applying a computational pulling force during the analytical placement of components of the circuit design, to pull a predetermined set of components of the circuit design towards at least a second predetermined location in the circuit design; and
   implementing the circuit design in a hardware circuit;
   wherein the analytical placement implements an equation that quantifies desirability of placement of the components, and the equation includes a first term corresponding to the spreading force and a second term corresponding to the pulling force, wherein the first term in the equation causes the equation to quantify a first placement of components as being more desirable than a second placement of the components as a result of a first location of at least one component in the first placement being a greater distance from a first designated area than a second location of the at least one component in the second placement, and the second term in the equation causes the equation to quantify a third placement of components as being more desirable than a fourth placement of the components as a result of a third location of at least one component in the third placement being a lesser distance from a second designated area than a fourth location of the at least one component in the fourth placement.

4. The method of claim 3, wherein the first term represents connections between all components and locations into which no additional components can be placed.

5. The method of claim 4, wherein the locations which no additional components can be placed are holes in the programmable device fabric due to large, fixed components.

6. The method of claim 5, wherein the large, fixed components comprise at least a CPU core.

7. The method of claim 3, wherein the second term represents virtual connections between components that can only be placed in a relatively small number of locations and each of the locations into which such components can be placed.

8. The method claim 7, wherein the components that can only be placed in the relatively small number of locations comprises at least one among a BlockRAM and a multiplier in a programmable logic device circuit design.

9. The method of claim 3, wherein the method further comprises the step of applying heuristics to adjust respective weights associated with the computational spreading force and the computational pulling force in an iteration of the analytical formulation.

10. The method of claim 3, wherein the equation minimizes total squared wirelength.

11. A system for analytical placement of components for a circuit design, comprising:
a presentation device;
a processor coupled to the presentation device, programmed to:
apply a computational spreading force during analytical placement of components of the circuit design to push components in the circuit design away from at least a first predetermined location in the circuit design; and
apply a computational pulling force during analytical placement of components of the circuit design to pull a predetermined set of components of the circuit design towards at least a second predetermined location in the circuit design;
wherein the analytical placement implements an equation that quantifies desirability of placement of the components, and the equation includes a first term corresponding to the computational spreading force and a second term corresponding to the computational pulling force, wherein the first term in the equation causes the equation to quantify a first placement of components as being more desirable than a second placement of the components as a result of a first location of at least one component in the first placement being a greater distance from a first designated area than a second location of the at least one component in the second placement, and the second term in the equation causes the equation to quantify a third placement of components as being more desirable than a fourth placement of the components as a result of a third location of at least one component in the third placement being a lesser distance from a second designated area than a fourth location of the at least one component in the fourth placement; and
wherein the resultant circuit design is implemented in a hardware circuit.

12. The system of claim 11, wherein the first term represents virtual connections between all components and locations into which no additional components can be placed.

13. The system of claim 11, wherein the second term represents virtual connections between components that can only be placed in a relatively small number of locations and each of the locations into which such components can be placed.

14. The system of claim 11, wherein the processor is further programmed to apply heuristics to adjust respective weights associated with the spreading force and the pulling force in an iteration of the analytical formulation.

15. A machine readable storage medium, having stored thereon a computer program having a plurality of code sections executable by a machine for causing the machine to perform the steps of:
applying a spreading force during analytical placement of components of the circuit design to push components in the circuit design away from at least a first predetermined location in the circuit design; and
applying a pulling force during analytical placement of components of the circuit design to pull a predetermined set of components of the circuit design towards at least a second predetermined location in the circuit design; and
wherein the analytical placement implements an equation that quantifies desirability of placement of the components, and the equation includes a first term corresponding to the computational spreading force and a second term corresponding to the computational pulling force, wherein the first term in the equation causes the equation to quantify a first placement of components as being more desirable than a second placement of the components as a result of a first location of at least one component in the first placement being a greater distance from a first designated area than a second location of the at least one component in the second placement, and the second term in the equation causes the equation to quantify a third placement of components as being more desirable than a fourth placement of the components as a result of a third location of at least one component in the third placement being a lesser distance from a second designated area than a fourth location of the at least one component in the fourth placement.

16. The machine readable storage medium of claim 15, wherein the first term represents connections between all components and locations into which no additional components can be placed.

17. The machine readable storage medium of claim 15, wherein the second term represents virtual connections between components that can only be placed in a relatively small number of locations and each of the locations into which such components can be placed.

* * * * *